(12) United States Patent
Kanehara et al.

(10) Patent No.: US 7,301,793 B2
(45) Date of Patent: Nov. 27, 2007

(54) SEMICONDUCTOR MEMORY DEVICE

(75) Inventors: Hidenari Kanehara, Osaka (JP);
Kazuki Tsujimura, Shiga (JP);
Norihiko Sumitani, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 155 days.

(21) Appl. No.: 10/879,753

(22) Filed: Jun. 30, 2004

(65) Prior Publication Data
US 2005/0002225 A1 Jan. 6, 2005

(30) Foreign Application Priority Data
Jul. 2, 2003 (JP) ............................ 2003-190052

(51) Int. Cl.
*G11C 5/06* (2006.01)
*G11C 8/00* (2006.01)

(52) U.S. Cl. ................... 365/63; 365/154; 365/156; 365/230.03; 365/230.05

(58) Field of Classification Search ................. 365/51, 365/63, 154, 156, 230.03, 230.05
See application file for complete search history.

(56) References Cited

U.S. PATENT DOCUMENTS 6,542,424 B2 * 4/2003 Endo et al. ................. 365/154
6,807,124 B2 * 10/2004 Tsuda et al. ............ 365/230.03
6,839,268 B2 * 1/2005 Osada et al. ................ 365/154
6,901,017 B2 * 5/2005 Shimizu ..................... 365/154

FOREIGN PATENT DOCUMENTS

| JP | 10-092163 | 4/1998 |
| JP | 11-134866 | 5/1999 |
| JP | 2002-100187 | 4/2002 |

OTHER PUBLICATIONS

Zhang, Kevin., et al. "the Scaling of Data Sensing Schemes for High Speed Cache Design in Sub-0.18um Technologies." Symposium on VLSI Circuits Digest of Technical Papers, 2000, pp. 2.
Silberman, Joel., et al. "A 1.6 ns Access, 1 GHz Two-Way Set-Predicted and Sum Indexed 64-kByter Data Cache." Symposium on VLSI Circuits Digest of Technical Papers, 2000, pp. 2.
Japanese Office Action for Corresponding Application No. JP 2003-190052 Mailed Feb. 20, 2007.

* cited by examiner

*Primary Examiner*—Trong Phan
(74) *Attorney, Agent, or Firm*—McDermott Will & Emery LLP

(57) ABSTRACT

A semiconductor memory device comprises a plurality of memory cell groups. Each memory cell group includes at least two memory cells. Each memory cell group includes a read section and a write section. The data of a memory cell is read from one bit line to a read global bit line through the read section. The write section is shared by at least two memory cells in the same memory cell group. Thus, writing of data in a memory cell is desirably achieved although the memory cell has a common 6-transistor structure.

8 Claims, 9 Drawing Sheets

SEMICONDUCTOR MEMORY DEVICE

BACKGROUND OF THE INVENTION

The present invention relates to a semiconductor memory device and specifically to a data writing method.

A conventional SRAM circuit is shown in FIG. 8. In FIG. 8, a large number of memory cells 100 are arranged in an array of rows and columns (only two cells are shown in FIG. 8). Each memory cell 100 is connected to a word line WL and a pair of bit lines (BIT, NBIT). Each memory cell 100 includes, as shown in FIG. 7, two load transistors MP1 and MP2 connected to predetermined power supply VDD, two drive transistors MN1 and MN2 connected to ground power supply VSS, and two transfer transistors MN3 and MN4. The gates of the two transfer transistors MN3 and MN4 are connected to the word line WL. The drains of the transfer transistors MN3 and MN4 are connected to the bit line pair (BIT, NBIT). The bit line pair (BIT, NBIT) is connected to a sense amplifier 800, which receives an enable signal SAE, through a column selector 801, which receives a select signal CA, and a pair of signal lines SO and NSO as shown in FIG. 8.

In the SRAM having such a structure, at the time of reading data, a word line WL which is connected to a memory cell 100 to be accessed is activated, the electrical potential is discharged from one of the pair of bit lines (BIT, NBIT) which are precharged to a predetermined potential when on standby, so that a minute potential difference is caused between the bit lines BIT and NBIT. This minute amplitude signal is amplified by the sense amplifier 800 through a column selector 801, and the amplified signal is output.

However, along with a decrease in the power supply voltage which is required by finer designs of elements and wirings, the potential difference of the minute amplitude signal which activates the sense amplifier 800 has had a larger ratio with respect to the power supply voltage. Thus, it has become more difficult to shorten a time interval between activation of the word line WL and activation of the sense amplifier 800.

For example, Joel Silberman et al., "A 1.6 ns Access, 1 GHz Two-Way Set-Predicted and Sum-Indexed 64-kByte Data Cache", 2000 Symposium on VLSI Circuits Digest of Technical Paper pp.220-221, proposes a structure shown in FIG. 9 which overcomes the above-described problems. In the structure of this document, 8 memory cells 900 (only two cells are shown in FIG. 9) are connected to a single read bit line RBIT, and this read bit line RBIT is connected to a global bit line RGBIT through a read section 910 which is formed by an NAND circuit ND and one N-type transistor N1. Thus, at the time of reading data, the time required for the bit line precharged at a predetermined potential to reach 0 V is shortened because the number of memory cells 900 connected to the read bit line RBIT is 8. Accordingly, the operation speed in a low-voltage condition is fast as compared with the SRAM having the structure of FIG. 8.

However, at the time of writing data, it is necessary to forcibly change the potential of one of the pair of bit lines (BIT, NBIT) to 0 V. If a write bit line WBIT is not provided in the semiconductor memory device of FIG. 9, the read bit line RBIT and the global bit line RGBIT are undesirably activated during the write operation, and as a result, data to be read is destroyed. In view of such, in the semiconductor memory device of FIG. 9, it is necessary to provide a write bit line WBIT independently of the read bit line RBIT. As shown in FIG. 9, the memory cell 900 is formed by 7 transistors, which include write access transistors MN3 and MN4 and a read access transistor MN5. Each transistor is connected to a pair of write bit lines WBIT and NWBIT and the read bit line RBIT. With such a structure, writing of data in the memory cell 900 is possible.

However, in the semiconductor memory device shown in FIG. 9, the number of transistors included in each memory cell 900 is 7, which is larger than that of a common memory cell of a 6-transistor structure, and accordingly, the memory area is larger than that of the 6-transistor structure.

SUMMARY OF THE INVENTION

An objective of the present invention is to provide a semiconductor memory device having a single read global bit line structure wherein writing of data in a memory cell is achieved without increasing the number of components of the memory cell.

According to the present invention, in order to achieve the above objective, a write section is shared among every two or more memory cells while each memory cell has a common 6-transistor structure.

Specifically, a semiconductor memory device of the present invention comprises: a plurality of memory cell groups, each of which includes a bit line pair consisting of first and second bit lines and at least two memory cells connected to the bit line pair; a read global bit line connected to the second bit line of the bit line pair of each memory cell group through a read section; and a write section provided in each memory cell group for writing data in a memory cell included in the memory cell group.

According to an embodiment, in the above semiconductor memory device, the first bit line of the bit line pair of each memory cell group is connected to first bit lines of bit line pairs of the other memory cell groups.

According to an embodiment, the above semiconductor memory device further comprises at least one write global bit line, wherein the write global bit line is connected to the write section of each memory cell group.

According to an embodiment, in the above semiconductor memory device, the write section of each memory cell group includes a tristate inverter, the input of the tristate inverter being connected to the first bit line of the bit line pair, the output of the tristate inverter being connected to the second bit line of the bit line pair, and a control terminal of the tristate inverter being connected to a write control signal.

According to an embodiment, in the above semiconductor memory device, the write section of each memory cell group includes: a first N-type transistor, the gate of the first N-type transistor being connected to the first bit line of the bit line pair, the source of the first N-type transistor being connected to a first power supply, and the drain of the first N-type transistor being connected to a first connection point; and a second N-type transistor, the gate of the second N-type transistor being connected to a write control signal, the source of the second N-type transistor being connected to a first connection point, and the drain of the second N-type transistor being connected to the second bit line of the bit line pair.

According to an embodiment, in the above semiconductor memory device, the write section of each memory cell group includes: a first tristate inverter, the input of the first tristate inverter being connected to the write global bit line, the output of the first tristate inverter being connected to the first bit line of the bit line pair, and a control terminal of the first tristate inverter being connected to a write control signal; and a second tristate inverter, the input of the second tristate inverter being connected to the first bit line of the bit line pair, the output of the second tristate inverter being connected to the second bit line of the bit line pair, and a control terminal of the second tristate inverter being connected to a write control signal.

According to an embodiment, in the above semiconductor memory device, the write section of each memory cell group includes: a tristate inverter, the input of the tristate inverter being connected to the write global bit line, the output of the tristate inverter being connected to the first bit line of the bit line pair, and a control terminal of the tristate inverter being connected to a write control signal; a first N-type transistor, the gate of the first N-type transistor being connected to the first bit line of the bit line pair, the source of the first N-type transistor being connected to a first power supply, and the drain of the first N-type transistor being connected to a first connection point; and a second N-type transistor, the gate of the second N-type transistor being connected to a write control signal, the source of the second N-type transistor being connected to the first connection point, and the drain of the second N-type transistor being connected to the second bit line of the bit line pair.

According to an embodiment, in the above semiconductor memory device, the write section of each memory cell group includes: a first N-type transistor, the gate of the first N-type transistor being connected to the write global bit line, the source of the first N-type transistor being connected to a first power supply, and the drain of the first N-type transistor being connected to a first connection point; a second N-type transistor, the gate of the second N-type transistor being connected to a write control signal, the source of the second N-type transistor being connected to the first connection point, and the drain of the second N-type transistor being connected to the second bit line of the bit line pair; and a third N-type transistor, the gate of the third N-type transistor being connected to a write control signal, the source of the third N-type transistor being connected to the write global bit line, and the drain of the third N-type transistor being connected to the first bit line of the bit line pair.

According to an embodiment, in the above semiconductor memory device, a part or the entirety of the write section of each memory cell group is shared among at least two write sections.

According to an embodiment, in the above semiconductor memory device, selection of the write control signal is determined according to a decode signal of an address which selects at least two memory cell groups.

According to an embodiment, in the above semiconductor memory device, the read section is provided in each memory cell group.

According to an embodiment, in the above semiconductor memory device, the read section includes a P-type transistor, the gate of the P-type transistor being connected to the second bit line of the bit line pair, the source of the P-type transistor being connected to a second power supply, and the drain of the P-type transistor being connected to the read global bit line.

As described above, in a semiconductor memory device of the present invention, each memory cell group includes a write section while the semiconductor memory device has a single read global bit line structure. Thus, it is not necessary to provide a write access transistor in each memory cell such that each memory cell includes 7 transistors as in a conventional device.

According to an embodiment, a part or the entirety of the write section of each memory cell group is shared by other write sections. Therefore, the number of elements of the write section is further reduced, and the circuit area is accordingly reduced.

According to an embodiment, selection of a write control signal is determined according to a decode signal of an address which selects at least two memory cell groups. Therefore, only a bit line of an accessed memory cell group is activated, while no electric current flows through bit lines of other unselected memory cell groups. As a result, the power consumption in the data write process is reduced.

DESCRIPTION OF THE PREFERRED EMBODIMENTS

Hereinafter, semiconductor memory devices according to preferred embodiments of the present invention are described with reference to the drawings.

Embodiment 1

Figure 1:
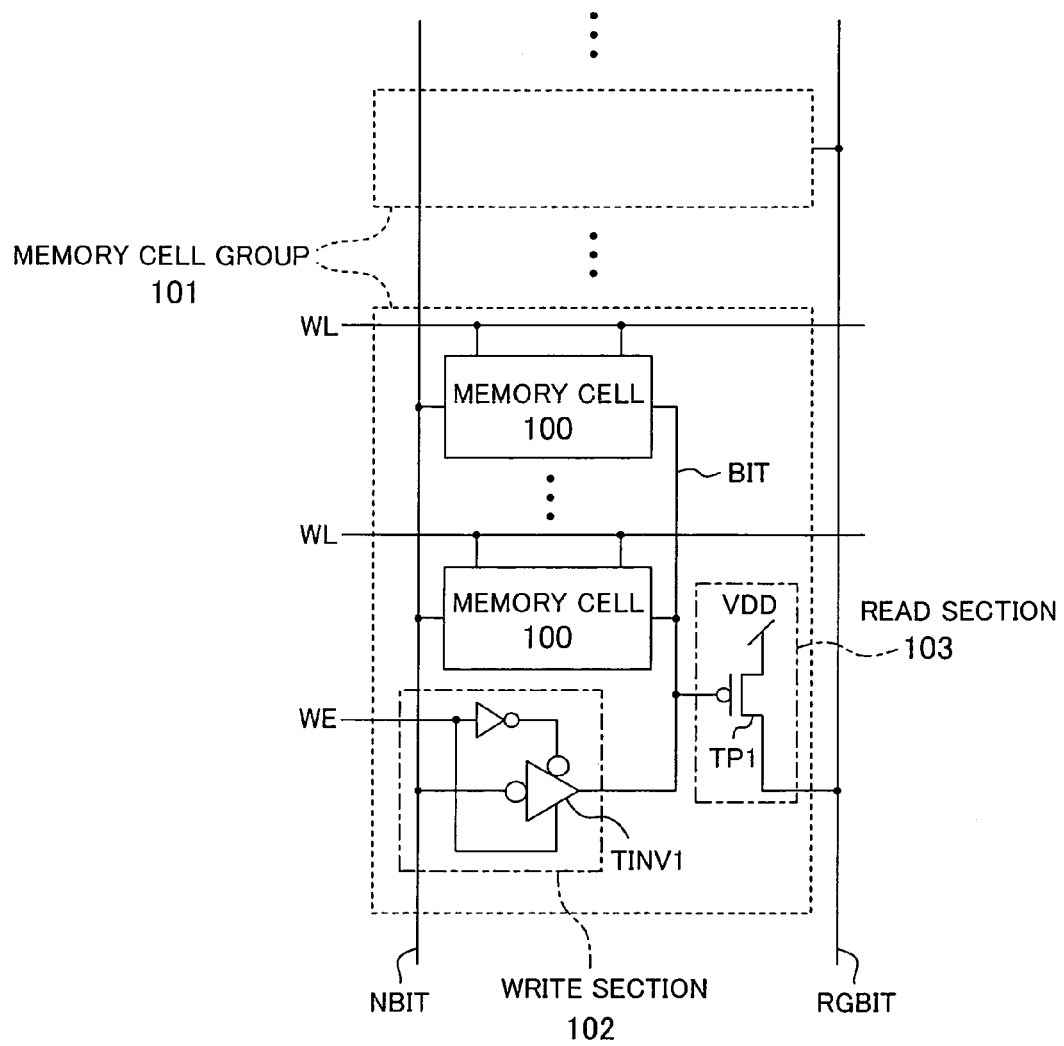
FIG. 1 is a circuit diagram showing a structure of a semiconductor memory device according to embodiment 1 of the present invention.

FIG. 1 shows a structure of a semiconductor memory device according to embodiment 1 of the present invention.

Figure 7:
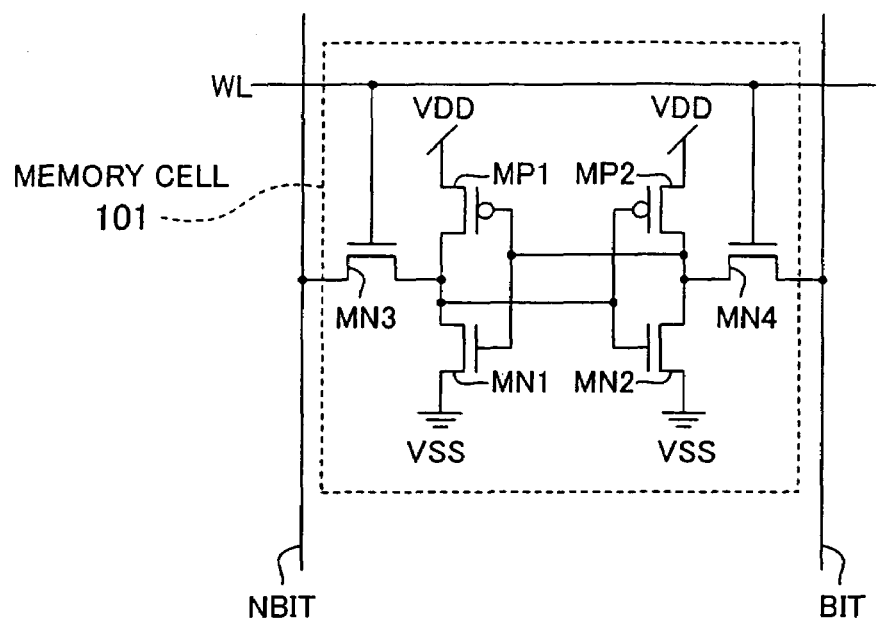
FIG. 7 is a circuit diagram showing a structure of a memory cell.
Figure 8:
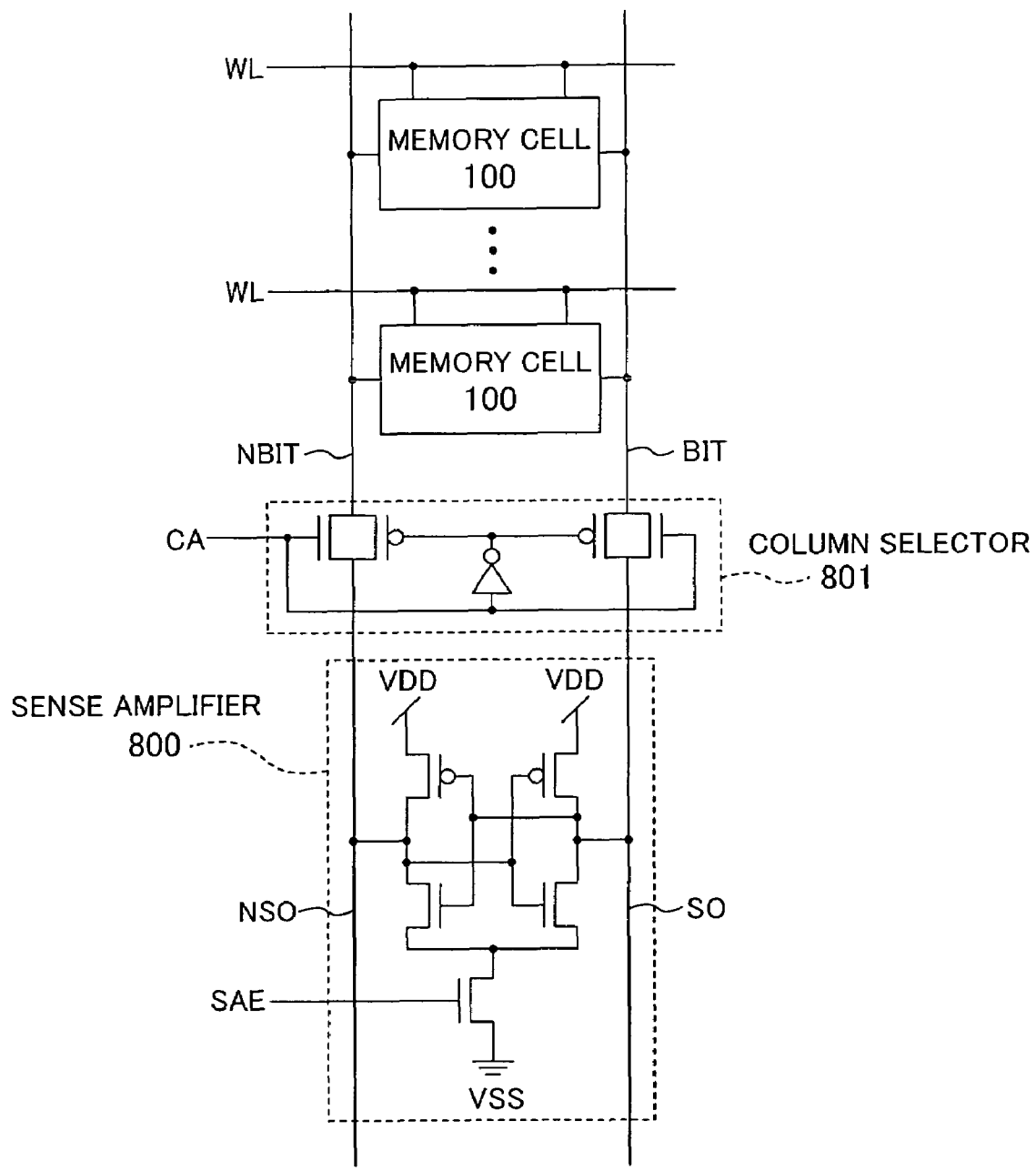
FIG. 8 is a circuit diagram showing a structure of a conventional semiconductor memory device.
Figure 9:
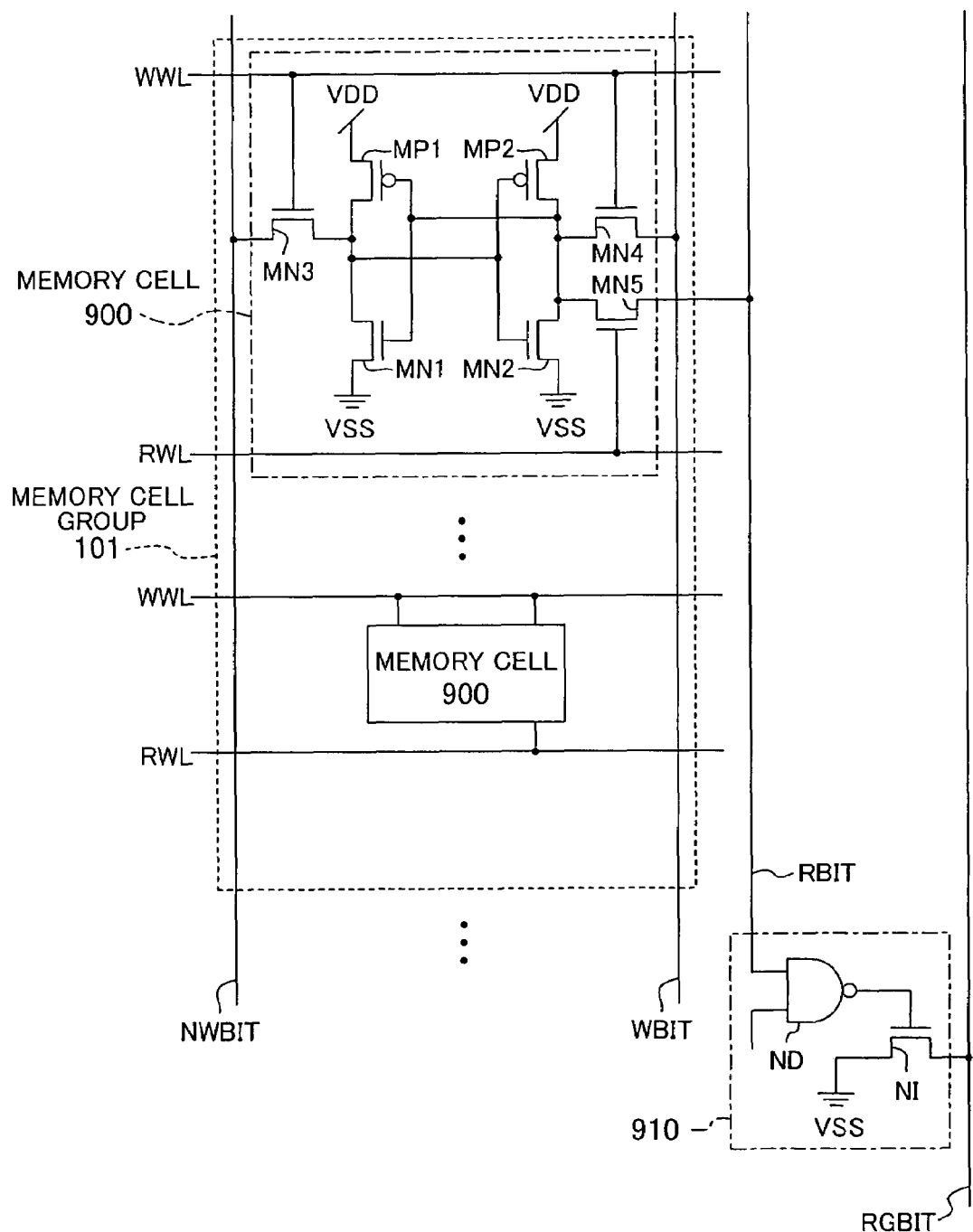
FIG. 9 is a circuit diagram showing a structure of another conventional semiconductor memory device.

In FIG. 1, a large number of memory cells 100 are arranged in an array (only two cells are shown in FIG. 1). As shown in FIG. 7, each memory cell 100 has a 6-transistor structure, which includes two load transistors MP1 and MP2, two drive transistors MN1 and MN2, and two transfer transistors MN3 and MN4. The sources of the two load transistors MP1 and MP2 are connected to predetermined power supply VDD. The drains of the two load transistors MP1 and MP2 are respectively connected to the sources of the transfer transistors MN3 and MN4 and to the drains of the drive transistors MN1 and MN2. The gates of the two load transistors MP1 and MP2 are respectively connected to the gates of the drive transistors MN1 and MN2 and to the drains of the two load transistors MP2 and MP1. The sources of the drive transistors MN1 and MN2 are connected to ground power supply VSS.

As shown in FIG. 1, at least two memory cells 100 aligned in the bit line direction (two cells in FIG. 1) are connected to the same bit line pair BIT, NBIT to constitute one memory cell group 101. Although not shown, there are a plurality of memory cell groups 101 along the row and column directions.

Among the memory cell groups 101 aligned in the bit line direction, the bit line NBIT (first bit line) of each memory cell group 101 is connected to bit lines NBIT of the other memory cell groups 101. That is, the bit line NBIT is common among the plurality of memory cell groups 101. On the other hand, the bit line BIT (second bit line) is connected to the read global bit line RGBIT through a read section 103 in the same memory cell group 101.

Each of the memory cell groups 101 includes a read section 103. The read section 103 has a P-type transistor TP1. The gate of the P-type transistor TP1 is connected to the bit line BIT. The source of the P-type transistor TP1 is connected to predetermined power supply (second power supply) VDD. The drain of the P-type transistor TP1 is connected to the read global bit line RGBIT.

Each of the memory cell groups 101 includes a write section 102. The write section 102 includes a tristate inverter TINV1 which is controlled by write control signal WE. The input of the tristate inverter TINV1 is connected to the bit line NBIT. The output of the tristate inverter TINV1 is connected to the bit line BIT.

Although not shown, selection of write control signal WE is determined according to a signal obtained by decoding an address which selects any one of the two or more memory cell groups 101. Thus, in a data write operation, only the write section 102 of the memory cell group 101 which includes a memory cell 100 in which data is to be written is activated by write control signal WE, and only the bit line BIT of this memory cell group 101 is activated. This applies not only to embodiment 1 but also to embodiment 2 and the subsequent embodiments.

Next, the operation of the semiconductor memory device shown in FIG. 1 is described.

In a standby state, the bit line pair (BIT, NBIT) is precharged to a predetermined potential while the read global bit line RGBIT is discharged. In a read operation, write control signal WE is in the inactive state, and a word line WL which is connected to a selected memory cell 100 is placed in the active state, whereby data in the memory cell 100 is transferred to the bit line BIT. In this process, if the data of the memory cell 100 is "0", an electric current flows from the bit line BIT to the memory cell 100 so that the bit line BIT is discharged, and the read section 103 operates to output the data to the read global bit line RGBIT. On the other hand, if the data of the memory cell 100 is "1", no electric current flows from the bit line BIT to the memory cell 100 so that the bit line BIT remains precharged, and the data is output through the read section 103 and the read global bit line RGBIT.

In a data write operation, write control signal WE is placed in the active state, and data to be written, which has been transferred to the bit line NBIT, is inverted at the write section 102 and transferred to the bit line BIT. A word line WL which is connected to a selected memory cell 100 is placed in the active state, and the data is written in the memory cell 100 from the bit line pair BIT, NBIT. In this process, in the case where data "1" is read onto the read global bit line RGBIT, data "1" on the read global bit line RGBIT is not destroyed even when the data to be written, "0", is transferred to the bit line BIT.

Thus, according to embodiment 1, although the semiconductor memory device has a single read global bit line (RGBIT) structure and each memory cell 100 has a common 6-transistor structure, writing of data in the memory cell 100 is achieved without destroying data which has been read onto the read global bit line RGBIT.

In the data write operation, write control signal WE is activated only for a selected memory cell group 101. Therefore, no electric current flows through the bit lines of unselected memory cell groups 101. As a result, the current consumption is reduced.

Embodiment 2

Figure 2:
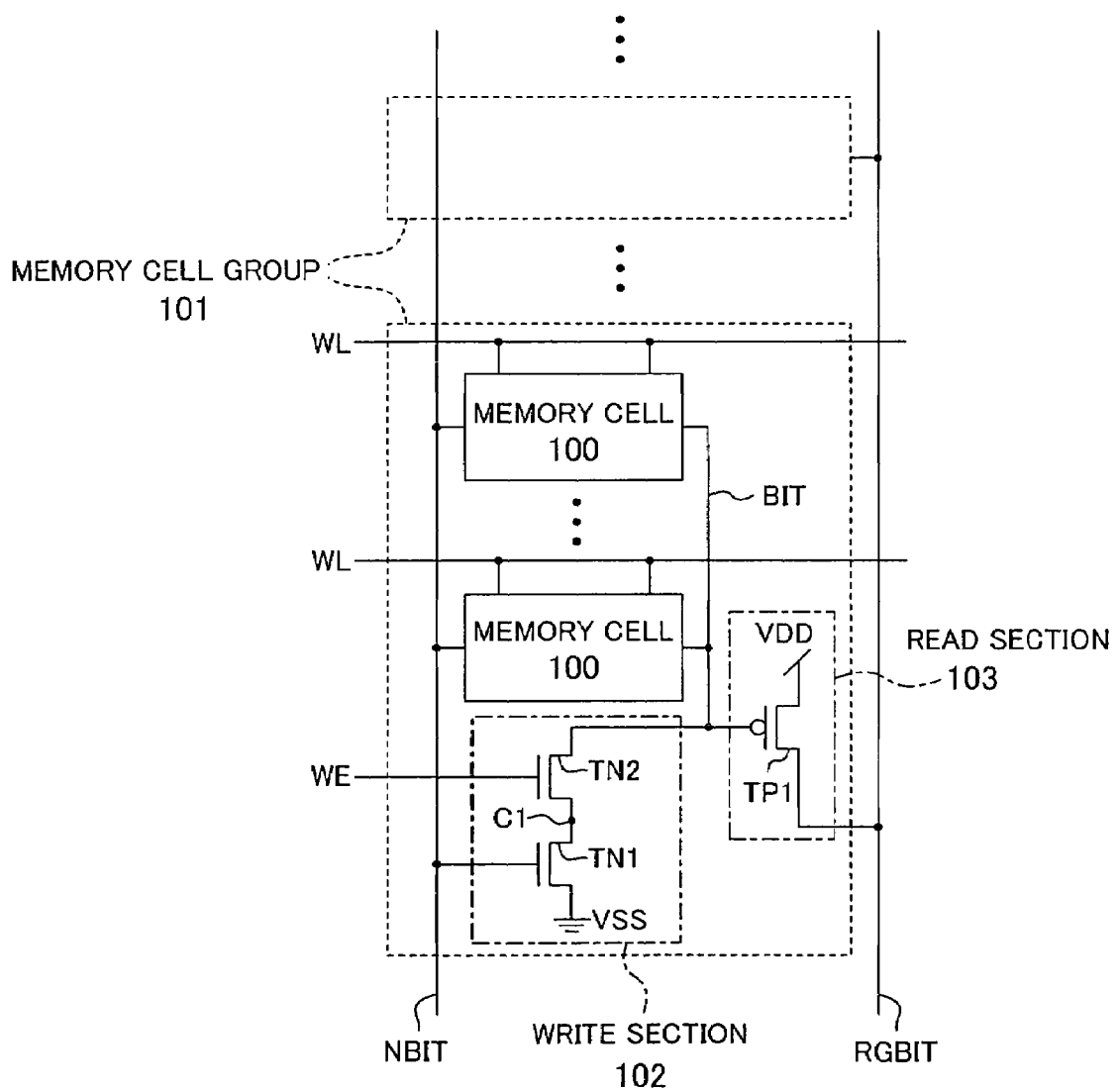
FIG. 2 is a circuit diagram showing a structure of a semiconductor memory device according to embodiment 2 of the present invention.

FIG. 2 shows a structure of a semiconductor memory device according to embodiment 2 of the present invention.

In FIG. 2, a plurality of memory cells 100 are arranged in an array as described in embodiment 1. At least two memory cells 100 are connected to the same bit line pair BIT, NBIT to constitute one memory cell group 101.

In a plurality of memory cell groups 101 aligned in the bit line direction, the bit line NBIT is common among the memory cell groups 101. On the other hand, the bit line BIT in each memory cell group 101 is connected to the read global bit line RGBIT through a read section 103 provided in the same memory cell group 101.

The read section 103 includes a P-type transistor TP1 as in embodiment 1. The gate of the P-type transistor TP1 is connected to the bit line BIT. The source of the P-type transistor TP1 is connected to predetermined power supply (second power supply) VDD. The drain of the P-type transistor TP1 is connected to the read global bit line RGBIT.

The write section 102 included in each memory cell group 101 of embodiment 2 is different from the write section 102 of embodiment 1 in that the write section 102 of embodiment 2 includes first and second N-type transistors TN1 and TN2. The gate of the first N-type transistor TN1 is connected to the bit line NBIT. The source of the first N-type transistor TN1 is connected to ground power supply (first power supply) VSS. The drain of the first N-type transistor TN1 is connected to a first connection point c1. Write control signal WE is input to the gate of the second N-type transistor TN2. The source of the second N-type transistor TN2 is connected to the first connection point c1. The drain of the second N-type transistor TN2 is connected to the bit line BIT.

Next, the operation of the semiconductor memory device of embodiment 2 is described.

In the first place, in a standby state, the bit line pair (BIT, NBIT) is precharged to a predetermined potential while the read global bit line RGBIT is discharged. In a read operation, write control signal WE is in the inactive state, and a word line WL which is connected to a selected memory cell 100 is placed in the active state, whereby data in the memory cell 100 is transferred to the bit line BIT. In this process, if the data of the memory cell 100 is "0", an electric current flows from the bit line BIT to the memory cell 100 so that the bit line BIT is discharged, and the data is output through the read section 103 and the read global bit line RGBIT. On the other hand, if the data of the memory cell 100 is "1", no electric current flows from the bit line BIT to the memory cell 100 so that the bit line BIT remains precharged, and the data is output through the read section 103 and the read global bit line RGBIT.

In a data write operation, write control signal WE is placed in the active state, and data to be written, which has been transferred to the bit line NBIT, is inverted at the write section 102 and transferred to the bit line BIT. A word line WL which is connected to a selected memory cell 100 is placed in the active state, and the data is written in the memory cell 100 from the bit line pair BIT, NBIT. In this process, in the case where data "1" is read onto the read global bit line RGBIT, data "1" on the read global bit line RGBIT is not destroyed even when the data to be written, "0", is transferred to the bit line BIT.

Thus, according to embodiment 2, although the semiconductor memory device has a single read global bit line (RGBIT) structure and each memory cell 100 has a common 6-transistor structure, writing of data in the memory cell 100 is achieved without destroying data which has been read onto the read global bit line RGBIT as in embodiment 1.

In the data write operation, write control signal WE is activated only for a selected memory cell group 101. Therefore, no electric current flows through the bit lines of unselected memory cell groups 101. As a result, the current consumption is reduced.

(Variation)

Figure 3:
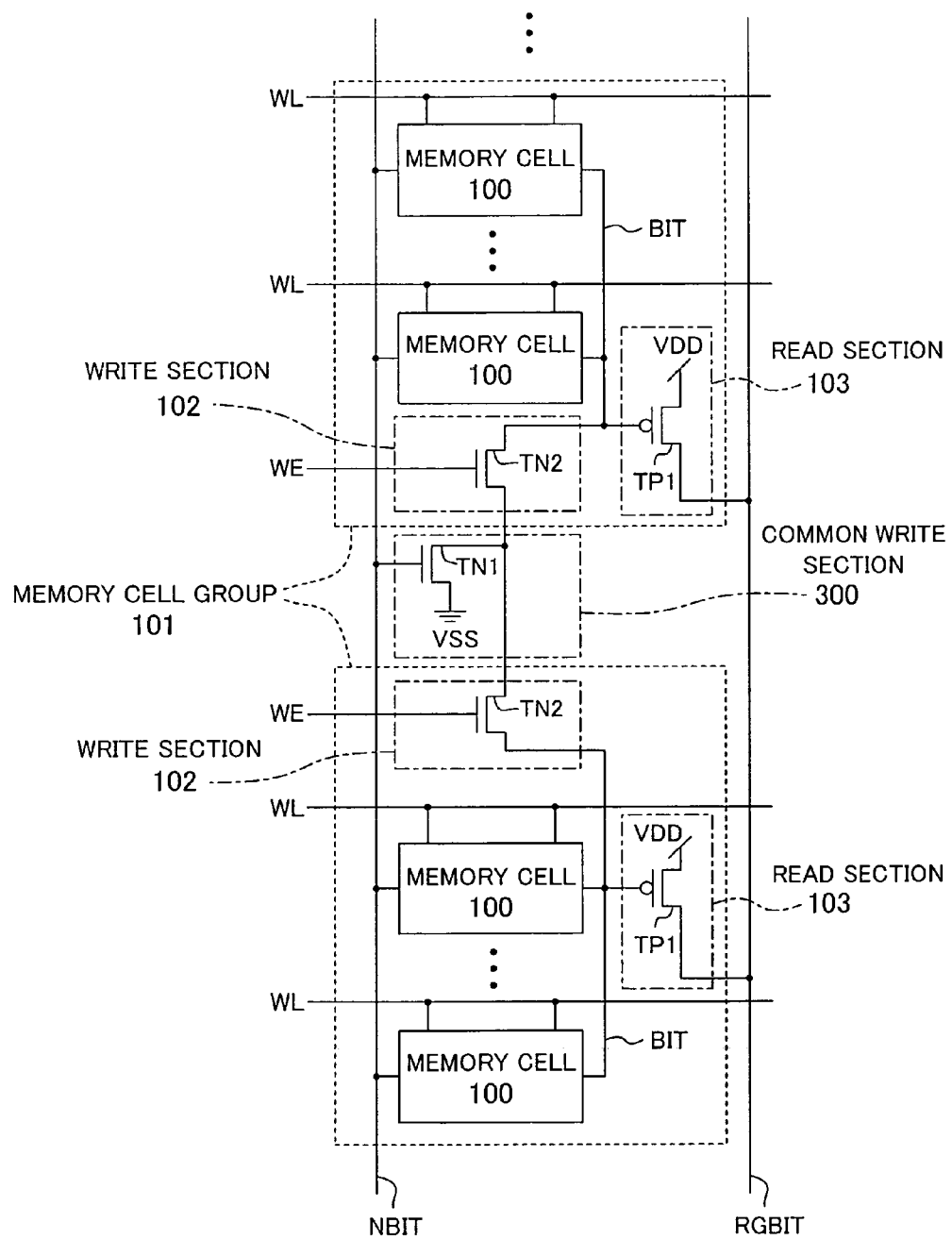
FIG. 3 is a circuit diagram showing a variation of the semiconductor memory device according to embodiment 2 of the present invention.

FIG. 3 shows a variation of embodiment 2.

This variation includes a common write section 300. The common write section 300 is common among two adjacent memory cell groups 101 which are aligned in the bit line direction. In the common write section 300, one N-type transistor TN1 connected to ground power supply VSS is shared by these two adjacent memory cell groups 101. On the other hand, each of the two write sections 102 corresponding to the two adjacent memory cell groups 101 only includes a second N-type transistor TN2. The gate of the second N-type transistor TN2 receives write control signal WE.

Thus, in this variation, a part of the write section is shared among at least two adjacent memory cell groups 101 which are aligned in the bit line direction, and accordingly, the number of components of the write section 102 is reduced, and the circuit area is also reduced.

It should be noted that although a part of the two write sections is shared in this variation, the entirety of the write sections may be shared.

Embodiment 3

Figure 4:
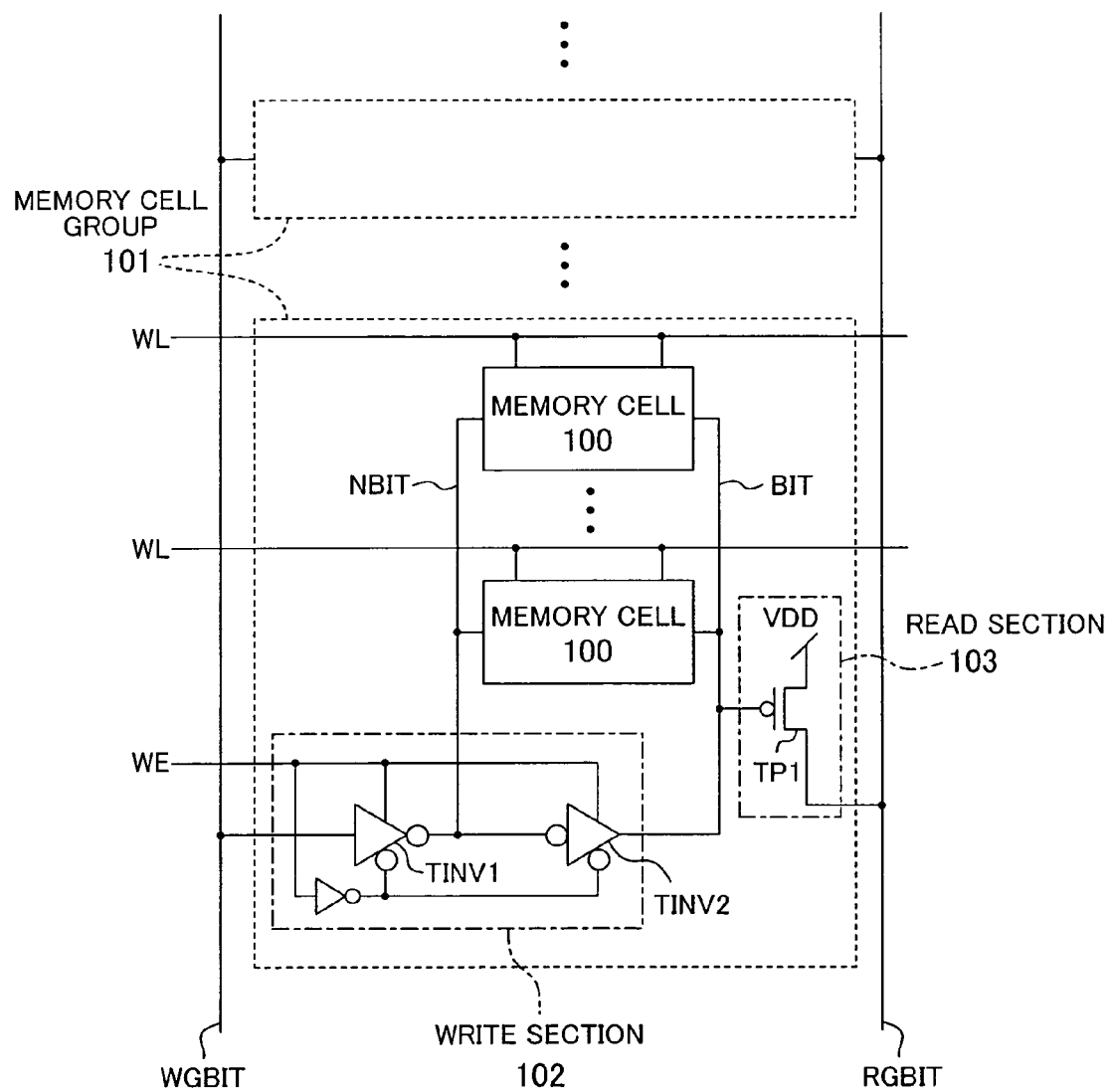
FIG. 4 is a circuit diagram showing a structure of a semiconductor memory device according to embodiment 3 of the present invention.

FIG. 4 shows a structure of a semiconductor memory device according to embodiment 3 of the present invention.

In FIG. 4, a plurality of memory cells 100 are arranged in an array. At least two memory cells 100 are connected to the same bit line pair BIT, NBIT to constitute one memory cell group 101. There are a plurality of such memory cell groups 101 aligned in the bit line direction. In the plurality of memory cell groups 101 aligned in the bit line direction, the bit line NBIT in the memory cell groups 101 is commonly connected. On the other hand, the bit line BIT in each memory cell group 101 is connected to the read global bit line RGBIT through a read section 103.

The read section 103 of each memory cell group 101 includes a P-type transistor TP1. The gate of the P-type transistor TP1 is connected to the bit line BIT. The source of the P-type transistor TP1 is connected to predetermined power supply VDD. The drain of the P-type transistor TP1 is connected to the read global bit line RGBIT.

Each memory cell group 101 includes a write section 102. The write section 102 includes first and second tristate inverters TINV1 and TINV2 which are controlled by write control signal WE. The input of the first tristate inverter TINV1 is connected to the write global bit line WGBIT. The output of the first tristate inverter TINV1 is connected to the bit line NBIT. The input of the second tristate inverter TINV2 is connected to the bit line NBIT. The output of the second tristate inverter TINV2 is connected to the bit line BIT.

In the semiconductor memory device shown in FIG. 4, in a standby state, the bit line pair (BIT, NBIT) is precharged to a predetermined potential while the read global bit line RGBIT is discharged. In a read operation, write control signal WE is in the inactive state, and a word line WL which is connected to a selected memory cell 100 is placed in the active state, whereby data in the memory cell 100 is transferred to the bit line BIT. In this process, if the data of the memory cell 100 is "0", an electric current flows from the bit line BIT to the memory cell 100 so that the bit line BIT is discharged, and the data is output through the read section 103 and the read global bit line RGBIT. On the other hand, if the data of the memory cell 100 is "1", no electric current flows from the bit line BIT to the memory cell 100 so that the bit line BIT remains precharged, and the data is output through the read section 103 and the read global bit line RGBIT.

In a data write operation, only write control signal WE input to the memory cell group 101 including a memory cell 100 in which data is to be written is placed in the active state, an inverted data of the data to be written which has been transferred to the write global bit line WGBIT is transferred to the bit line NBIT through the first tristate inverter TINV1 of the write section 102. This inverted data is inverted by the second tristate inverter TINV2 and transferred to the bit line BIT. A word line WL which is connected to a selected memory cell 100 is placed in the active state, and the data is written in the memory cell 100 from the bit line pair (BIT, NBIT). In this process, in the case where data "1" is read onto the read global bit line RGBIT, data "1" on the read global bit line RGBIT is retained and not destroyed even when the data to be written in the bit line BIT is "0".

Thus, according to embodiment 3, although the semiconductor memory device has a single read global bit line structure as in embodiments 1 and 2, writing of data in the memory cell 100 is desirably achieved without increasing the number of components of each memory cell 100. Furthermore, no electric current flows through the bit lines of unselected memory cell groups 101. As a result, the current consumption is reduced.

Embodiment 4

Figure 5:
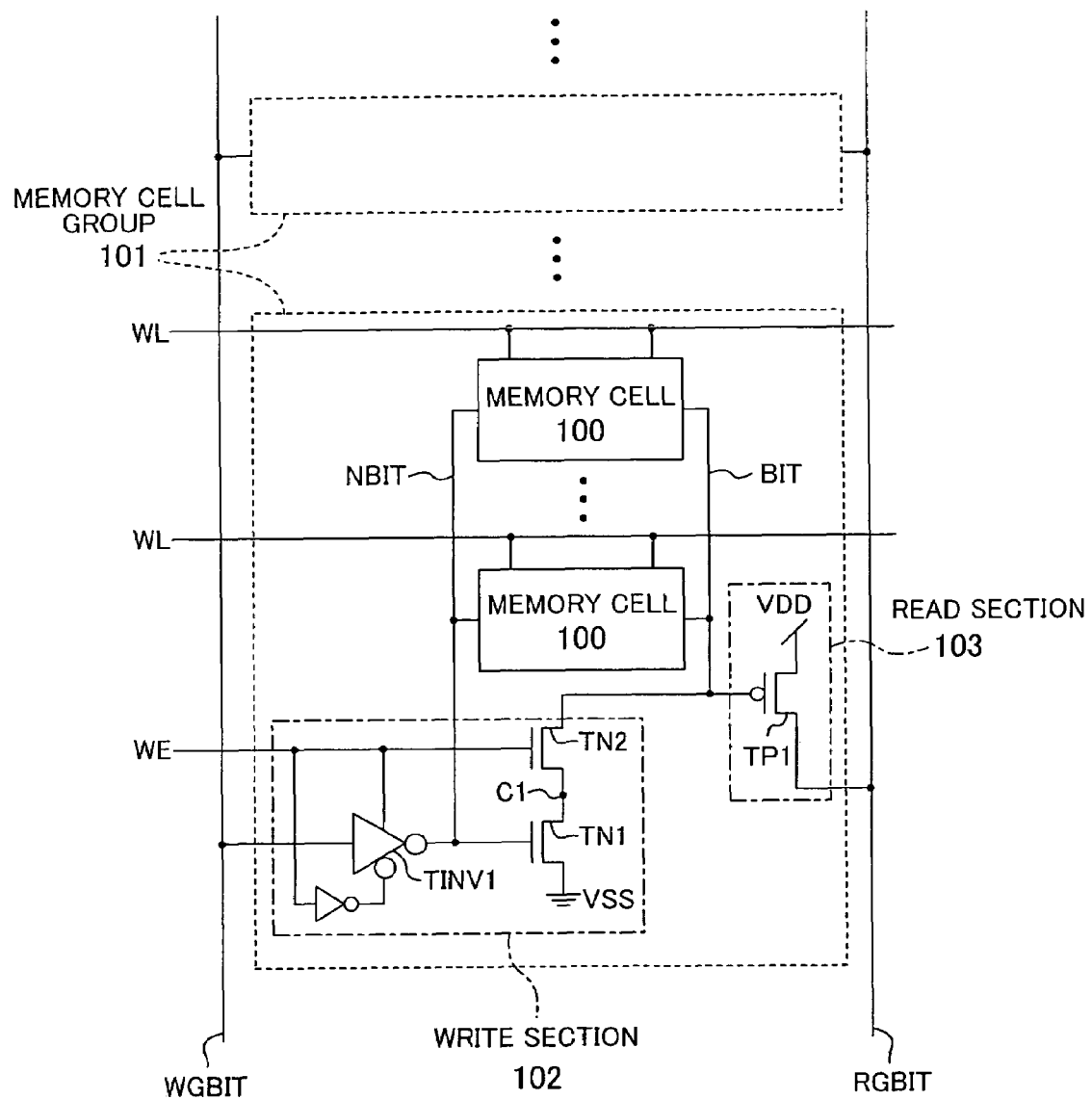
FIG. 5 is a circuit diagram showing a structure of a semiconductor memory device according to embodiment 4 of the present invention.

FIG. 5 shows a structure of a semiconductor memory device according to embodiment 4 of the present invention.

The semiconductor memory device shown in FIG. 5 is different from the semiconductor memory device shown in FIG. 4 only in the structure of the write section 102. Hereinafter, the internal structure of the write section 102 of embodiment 4 is described.

The write section 102 of each memory cell group 101 includes a tristate inverter TINV1 which is controlled by write control signal WE and serially-connected first and second N-type transistors TN1 and TN2. The input of the tristate inverter TINV1 is connected to the write global bit line WGBIT. The output of the tristate inverter TINV1 is connected to the bit line NBIT. The gate of the first N-type transistor TN1 is connected to the bit line NBIT. The source of the first N-type transistor TN1 is connected to ground power supply VSS. The drain of the first N-type transistor TN1 is connected to the first connection point c1. The gate of the second N-type transistor TN2 is connected to write control signal WE. The source of the second N-type transistor TN2 is connected to the first connection point c1. The drain of the second N-type transistor TN2 is connected to the bit line BIT.

In embodiment 4, the operation of the semiconductor memory device in the standby state and during the data read operation is the same as the operation of the semiconductor memory device of embodiment 3 shown in FIG. 4.

In a data write operation, only write control signal WE input to the memory cell group 101 including a memory cell 100 in which data is to be written is placed in the active state. In the meantime, the data to be written, which has been transferred to the write global bit line WGBIT, is inverted at the tristate inverter TINV1 and transferred to the bit line NBIT and is, on the other hand, inverted by the first N-type transistor TN1 of the write section 102 and transferred to the bit line BIT through the second N-type transistor TN2. A word line WL which is connected to a selected memory cell 100 is placed in the active state, and the data is written in the memory cell 100 from the bit line pair (BIT, NBIT). In this process, in the case where data "1" is read onto the read global bit line RGBIT, data "1" on the read global bit line RGBIT is retained and not destroyed even when the data to be written in the bit line BIT is "0".

Thus, also in embodiment 4, although the semiconductor memory device has a single read global bit line structure as in embodiments 1 to 3, writing of data in the memory cell 100 is desirably achieved without increasing the number of components of each memory cell 100. Furthermore, no electric current flows through the bit lines of unselected memory cell groups 101. As a result, the current consumption is reduced.

Furthermore, as in the example of FIG. 3, the first N-type transistor TN1 of the write section 102 is shared among the two or more adjacent memory cell groups 101 which are aligned in the bit line direction, and a common write section 300 is provided. With such a structure, the number of components of the write section 102 is reduced, and the circuit area is further reduced.

Embodiment 5

Figure 6:
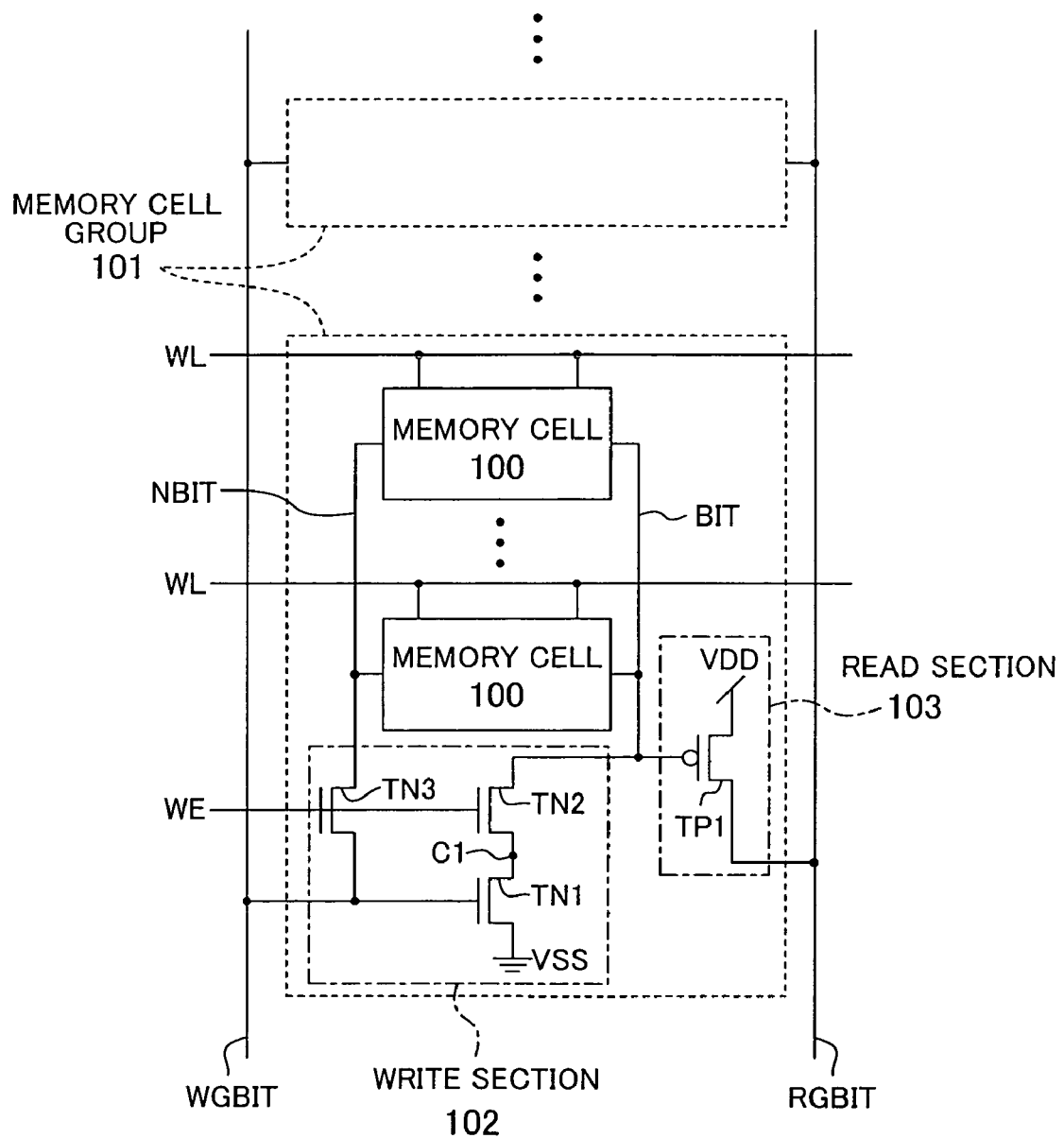
FIG. 6 is a circuit diagram showing a structure of a semiconductor memory device according to embodiment 5 of the present invention.

FIG. 6 shows a structure of a semiconductor memory device according to embodiment 5 of the present invention.

The semiconductor memory device shown in FIG. 6 is different from the semiconductor memory device shown in FIG. 5 only in the structure of the write section 102. Hereinafter, the internal structure of the write section 102 of embodiment 5 is described.

The write section 102 of each memory cell group 101 includes first, second and third N-type inverters TN1, TN2 and TN3. The gate of the first N-type transistor TN1 is connected to the write global bit line WGBIT. The source of the first N-type transistor TN1 is connected to ground power supply VSS. The drain of the first N-type transistor TN1 is connected to the first connection point c1. Write control signal WE is input to the gate of the second N-type transistor TN2. The source of the second N-type transistor TN2 is connected to the first connection point c1. The drain of the second N-type transistor TN2 is connected to the bit line BIT. Write control signal WE is also input to the gate of the third N-type transistor TN3. The source of the third N-type transistor TN3 is connected to the write global bit line WGBIT. The drain of the third N-type transistor TN3 is connected to the bit line NBIT.

In embodiment 5, the operation of the semiconductor memory device in the standby state and during the data read operation is the same as the operation of the semiconductor memory device of embodiment 3 shown in FIG. 4.

In a data write operation, only write control signal WE input to the memory cell group 101 including a memory cell 100 in which data is to be written is placed in the active state. The data to be written, which has been transferred to the write global bit line WGBIT, is transferred to the bit line NBIT through the third N-type transistor TN3 of the write section 102 and is, on the other hand, inverted by the first N-type transistor TN1 and transferred to the bit line BIT through the second N-type transistor TN2. A word line WL which is connected to a selected memory cell 100 is placed in the active state, and the data is written in the memory cell 100 from the bit line pair (BIT, NBIT). In this process, in the case where data "1" is read onto the read global bit line RGBIT, data "1" on the read global bit line RGBIT is retained and not destroyed even when the data to be written in the bit line BIT is "0".

Thus, also in embodiment 5, although the semiconductor memory device has a single read global bit line structure as in embodiments 1 to 4, writing of data in the memory cell 100 is desirably achieved without increasing the number of components of each memory cell 100. Furthermore, no electric current flows through the bit lines of unselected memory cell groups 101. As a result, the current consumption is reduced.

Furthermore, as in the example of FIG. 3, the first N-type transistor TN1 of the write section 102 is shared among two or more adjacent memory cell groups 101 which are aligned in the bit line direction, and a common write section 300 is provided. With such a structure, the number of components of the write section 102 is reduced, and the circuit area is further reduced.

What is claimed is:
1. A semiconductor memory device comprising:
    a plurality of memory cell groups, each of which includes
        a bit line pair consisting of first and second bit lines and at least two memory cells connected to the bit line pair;
    a read global bit line connected to the second bit line of the bit line pair of each memory cell group through a read section; and
    a write section connected to the bit line pair and provided in each memory cell group for writing data in a memory cell included in the memory cell group,
    wherein the first bit line of the bit line pair of each memory cell group is connected to first bit lines of bit line pairs of the other memory cell groups which are different from each memory cell group.
2. The semiconductor memory device of claim 1, wherein the write section of each memory cell group includes a tristate inverter, the input of the tristate inverter being connected to the first bit line of the bit line pair, the output of the tristate inverter being connected to the second bit line of the bit line pair, and a control terminal of the tristate inverter being connected to a write control signal.
3. The semiconductor memory device of claim 1, wherein the write section of each memory cell group includes:
    a first N-type transistor, the gate of the first N-type transistor being connected to the first bit line of the bit line pair, the source of the first N-type transistor being connected to a first power supply, and the drain of the first N-type transistor being connected to a first connection point; and
    a second N-type transistor, the gate of the second N-type transistor being connected to a write control signal, the source of the second N-type transistor being connected to a first connection point, and the drain of the second N-type transistor being connected to the second bit line of the bit line pair.

4. The semiconductor memory device of claim 1, further comprising at least one write global bit line,
wherein the write global bit line is connected to the write section of each memory cell group, and
wherein the write section of each memory cell group includes:
a first tristate inverter, the input of the first tristate inverter being connected to the write global bit line, the output of the first tristate inverter being connected to the first bit line of the bit line pair, and a control terminal of the first tristate inverter being connected to a write control signal; and
a second tristate inverter, the input of the second tristate inverter being connected to the first bit line of the bit line pair, the output of the second tristate inverter being connected to the second bit line of the bit line pair, and a control terminal of the second tristate inverter being connected to a write control signal.

5. The semiconductor memory device of claim 1, further comprising at least one write global bit line,
wherein the write global bit line is connected to the write section of each memory cell group, and
wherein the write section of each memory cell group includes:
a tristate inverter, the input of the tristate inverter being connected to the write global bit line, the output of the tristate inverter being connected to the first bit line of the bit line pair, and a control terminal of the tristate inverter being connected to a write control signal;
a first N-type transistor, the gate of the first N-type transistor being connected to the first bit line of the bit line pair, the source of the first N-type transistor being connected to a first power supply, and the drain of the first N-type transistor being connected to a first connection point; and
a second N-type transistor, the gate of the second N-type transistor being connected to a write control signal, the source of the second N-type transistor being connected to the first connection point, and the drain of the second N-type transistor being connected to the second bit line of the bit line pair.

6. The semiconductor memory device of claim 1 further comprising at least one write global bit line,
wherein the write global bit line is connected to the write section of each memory cell group, and
wherein the write section of each memory cell group includes:
a first N-type transistor, the gate of the first N-type transistor being connected to the write global bit line, the source of the first N-type transistor being connected to a first power supply, and the drain of the first N-type transistor being connected to a first connection point;
a second N-type transistor, the gate of the second N-type transistor being connected to a write control signal, the source of the second N-type transistor being connected to the first connection point, and the drain of the second N-type transistor being connected to the second bit line of the bit line pair; and
a third N-type transistor, the gate of the third N-type transistor being connected to a write control signal, the source of the third N-type transistor being connected to the write global bit line, and the drain of the third N-type transistor being connected to the first bit line of the bit line pair.

7. The semiconductor memory device of claim 1,
wherein the read section is provided in each memory cell group, and
wherein the read section includes a P-type transistor, the gate of the P-type transistor being connected to the second bit line of the bit line pair, the source of the P-type transistor being connected to a second power supply, and the drain of the P-type transistor being connected to the read global bit line.

8. A semiconductor memory device comprising:
a plurality of memory cell groups, each of which includes a bit line pair consisting of first and second bit lines and at least two memory cells connected to the bit line pair;
a read global bit line connected to the second bit line of the bit line pair of each memory cell group through a read section; and
a write section connected to the bit line pair and provided in each memory cell group for writing data in a memory cell included in the memory cell group,
wherein at least a part of the write section of each memory cell group is shared among at least two write sections.

* * * * *